US006459150B1

(12) United States Patent
Wu et al.

(10) Patent No.: US 6,459,150 B1
(45) Date of Patent: Oct. 1, 2002

(54) ELECTRONIC SUBSTRATE HAVING AN APERTURE POSITION THROUGH A SUBSTRATE, CONDUCTIVE PADS, AND AN INSULATING LAYER

(75) Inventors: Enboa Wu; Tsung-Yao Chu, both of Taipei; Hsin-Chien Huang; Rong-Shen Lee, both of Hsinchu, all of (TW)

(73) Assignee: Industrial Technology Research Institute, Hsin Chu (TW)

( * ) Notice: Subject to any disclaimer, the term of this patent is extended or adjusted under 35 U.S.C. 154(b) by 0 days.

(21) Appl. No.: 09/641,258

(22) Filed: Aug. 17, 2000

(51) Int. Cl.[7] ................................ H01L 23/34

(52) U.S. Cl. ...................... 257/724; 257/738; 257/774; 257/778; 257/779; 257/780; 361/768; 228/180.22

(58) Field of Search ............................ 257/737, 738, 257/774, 780, 779, 723, 724, 778, 701; 228/180, 22; 361/768; 438/106, 108, 612

(56) References Cited

U.S. PATENT DOCUMENTS 5,742,100 A * 4/1998 Schroeder et al. .......... 257/778
5,959,462 A * 9/1999 Lum .......................... 324/765
6,107,109 A * 8/2000 Akram et al. ................ 438/15
6,207,447 B1 * 3/2001 Motooka et al. ............ 438/113
6,242,935 B1 * 6/2001 Akram ....................... 324/765
6,277,669 B1 * 8/2001 Kung et al. ................. 438/106
6,284,563 B1 * 9/2001 Fjelstad ...................... 438/106
6,294,837 B1 * 9/2001 Akram et al. ............... 257/774

FOREIGN PATENT DOCUMENTS

JP 8-213427 * 8/1996
JP 11-112135 * 4/1999
JP 11-87897 * 9/1999
JP 2000-286304 * 10/2000

* cited by examiner

*Primary Examiner*—David L. Talbott
*Assistant Examiner*—Alonzo Chambliss
(74) *Attorney, Agent, or Firm*—Tung & Associates

(57) ABSTRACT

A single-step bumping/bonding method for forming a semiconductor package of two electronic substrates electrically connected together by solder bumps. In the method, a first electronic substrate is provided equipped with a first plurality of conductive pads formed in an insulating material layer, the plurality of conductive pads each having an aperture formed therethrough for receiving a solder material when the first electronic substrate is positioned juxtaposed to a second electronic substrate equipped with a second plurality of conductive pads such that solder bumps may be formed bonding the first plurality of conductive pads to the second plurality of conductive pads. One of the two electronic substrates may be a silicon wafer, while the other may be a printed circuit board or a silicon wafer.

9 Claims, 5 Drawing Sheets

50 64 92 58 92 62 80 86 82 88 100 82 100

ELECTRONIC SUBSTRATE HAVING AN APERTURE POSITION THROUGH A SUBSTRATE, CONDUCTIVE PADS, AND AN INSULATING LAYER

FIELD OF THE INVENTION

The present invention generally relates to a method for forming semiconductor packages and devices formed and more particularly, relates to a single-step method for forming semiconductor packages in which a bumping and a bonding step are carried out simultaneously and the packages formed.

BACKGROUND OF THE INVENTION

In the fabrication of modern semiconductor devices, the ever increasing device density and decreasing device dimensions demand more stringent requirements in the packaging or interconnecting techniques in such high density devices. Conventionally, a flip-chip attachment method has been used in packaging of semiconductor chips. In the flip-chip attachment method, instead of attaching a semiconductor die to a lead frame in a package, an array of solder bumps is formed on the surface of the die. The formation of the solder bumps may be carried out in an evaporation method by using a composite material of tin and lead through a mask for producing a desired pattern of solder bumps. The technique of electrodeposition has been more recently developed to produce solder bumps in flip-chip packaging process.

Other techniques that are capable of solder-bumping a variety of substrates to form solder balls have also been proposed. The techniques generally work well in bumping semiconductor substrates that contain solder structures over a minimal size. For instance, one of such widely used techniques is a solder paste screening method which has been used to cover the entire area of an eight inch wafer. However, with recent trend in the miniaturization of device dimensions and the necessary reduction in bump-to-bump spacing (or pitch), the use of the solder paste screening technique has become more difficult.

Other techniques for forming solder bumps such as the controlled collapse chip connection (C4) technique and the thin film electrodeposition technique have also been used in recent years in the semiconductor fabrication industry. The C4 technique is generally limited by the resolution achievable by a molybdenum mask which is necessary for the process. Fine-pitched solder bumps are therefore difficult to be fabricated by the C4 technique. Similarly, the thin film electrodeposition technique which also requires a ball limiting metallurgy layer to be deposited and defined by an etching process which has the same limitations as the C4 technique. For instance, a conventional thin film electrodeposition process for depositing solder bumps is shown in FIGS. 1A~1F.

A conventional semiconductor structure 10 is shown in FIG. 1A. The semiconductor structure 10 is built on a silicon substrate 12 with active devices built therein. A bond pad 14 is formed on a top surface 16 of the substrate 12 for making electrical connections to the outside circuits. The bond pad 14 is normally formed of a conductive metal such as aluminum. The bond pad 14 is passivated by a final passivation layer 20 with a window 22 opened by a photolithography process to allow electrical connection to be made to the bond pad 14. The passivation layer 20 may be formed of any one of various insulating materials such as oxide, nitride or organic materials. The passivation layer 20 is applied on top of the semiconductor device 10 to provide both planarization and physical protection of the circuits formed on the device 10.

Onto the top surface 24 of the passivation layer 20 and the exposed top surface 18 of the bond pad 14, is then deposited an under bump metallurgy layer 26. This is shown in FIG. 1B. The under bump metallurgy (UBM) layer 26 normally consists of an adhesion/diffusion barrier layer 30 and a wetting layer 28. The adhesion/diffusion barrier layer 30 may be formed of Ti, TiN or other metal such as Cr. The wetting layer 28 is normally formed of a Cu layer or a Ni layer. The UBM layer 26 improves bonding between a solder ball to be formed and the top surface 18 of the bond pad 14.

In the next step of the process, as shown in FIG. 1C, a photoresist layer 34 is deposited on top of the UBM layer 26 and then patterned to define a window opening 38 for the solder ball to be subsequently formed. In the following electrodeposition process, a solder ball 40 is electrodeposited into the window opening 38 forming a structure protruded from the top surface 42 of the photoresist layer 34. The use of the photoresist layer 34 must be carefully controlled such that its thickness is in the range between about 30 $\mu$m and about 40 $\mu$m, preferably at a thickness of about 35 $\mu$m. The reason for the tight control on the thickness of the photoresist layer 34 is that, for achieving a fine-pitched solder bump formation, a photoresist layer of a reasonably small thickness must be used such that a high imaging resolution can be achieved. It is known that, during a photolithography process, the thicker the photoresist layer, the poorer is the imaging process. To maintain a reasonable accuracy in the imaging process on the photoresist layer 34, a reasonably thin photoresist layer 34 must be used which results in a mushroom configuration of the solder bump 40 deposited therein. The mushroom configuration of the solder bump 40 contributes greatly to the inability of a conventional process in producing fine-pitched solder bumps.

Referring now to FIG. 1E, wherein the conventional semiconductor structure 10 is shown with the photoresist layer 34 removed in a wet stripping process. The mushroom-shaped solder bump 40 remains while the under bump metallurgy layer 26 is also intact. In the next step of the process, as shown in FIG. 1F, the UBM layer 26 is etched away by using the solder bump 40 as a mask in an wet etching process. The solder bump 40 is then heated in a reflow process to form solder ball 44. The reflow process is conducted at a temperature that is at least the reflow temperature of the solder material.

In recent years, chip scale packages (CSP) have been developed as a new low cost packaging technique for high volume production of IC chips. One of such chip scale packaging techniques has been developed by the Tessera Company for making a so-called micro-BGA package. The micro-BGA package can be utilized in an environment where several of the packages are arranged in close proximity on a circuit board or a substrate much like the arrangement of individual tiles. Major benefits achieved by a micro-BGA package are the combined advantages of a flip chip assembly and a surface mount package. The chip scale packages can be formed in a physical size comparable to that of an IC chip even though, unlike a conventional IC chip such as a flip chip, the chip scale package does not require a special bonding process for forming solder balls. Furthermore, a chip scale package may provide larger number of input/output terminals than that possible from a conventional quad flat package, even though a typical quad flat package is better protected mechanically from the environment.

A unique feature of the chip scale package is the use of an interposer layer that is formed of a flexible, compliant material. The interposer layer provides the capability of absorbing mechanical stresses during the package forming steps and furthermore, allows thermal expansion mismatch between the die and the substrate. The interposer layer, therefore, acts both as a stress buffer and as a thermal expansion buffer. Another unique feature of the chip scale package, i.e. such as a micro-BGA package, is its ability to be assembled to a circuit board by using conventional surface mount technology (SMT) processes.

In a typical micro-BGA package, a flexible interposer layer (which may contain circuit) is used to interconnect bond pads on an IC chip to an array of solder bump connections located on a flexible circuit. The flexible circuit, normally of a thickness of approximately 25 $\mu$m, is formed of a polymeric material such as polyimide which is laminated to a silicon elastomer layer of approximately 150 $\mu$m thick. The silicon elastomeric layer provides flexibility and compliance in all three directions for relief of stresses and thermal expansion mismatches. To further reduce the fabrication cost of IC devices, it is desirable that if a whole wafer can be passivated to seal the IC dies on the wafer, and then be severed into individual IC dies from the wafer such that not only the benefits of a chip scale package can be realized, the packaging cost for the IC dies may further be reduced.

A large number of IC chips are designed with a peripheral array of I/O pads. For modern high density devices, the pitch allowed between I/O pads is steadily decreasing. An I/O pad redistribution process is frequently necessary for changing a peripheral array to an area array in order to improve pitch between the conductive pads. During the redistribution process, metal traces are frequently used to extend bond pads from a peripheral area to a center area on the chip. Due to the limited space available for the metal traces, especially those traces that run an extended distance, it is desirable to produce metal traces that are stress buffered in order to assure the reliability of a chip.

The conventional flip chip bonding process requires multiple preparation steps for IC chips, i.e. the formation of aluminum bond pads on the chip, the under-bump-metallurgy process on the bond pads and the deposition of solder required in the bumping process. The substrate that the IC chip is bonded to requires a flux coating in order to ensure an acceptable bond strength is formed between the solder bumps and the conductive elements on the substrate surface. The flip chip bonding process further requires a reflow process for the bumps, a flux cleaning process to eliminate excess flux material from the surface of the bump, a drying process after the cleaning process, an underfill process for dispensing an underfill material, and an underfill curing process to minimize thermal stresses in the underfill and in the joint formed.

The conventional method for depositing solder bumps described above therefore presents a number of processing difficulties. For instance, one of the difficulties is the large volume of solder used to form a mushroom-shaped bump which impedes the process of making fine-pitched bumps. Another difficulty is the requirement of a flux coating step to ensure adhesion between a bump pad and a solder bump. The requirement of a solder reflow process further complicates the flip chip bonding method and increases its costs. It is therefore desirable to implement a flip chip bonding process that does not require separate processing bonding the bumps to a substrate.

It is therefore an object of the present invention to provide a single-step bumping/bonding method for forming semiconductor packages that does not have the drawbacks or shortcomings of the conventional method.

It is another object of the present invention to provide a single-step bumping/bonding method for forming semiconductor packages in which the formation of solder bumps and the bonding of an IC device to a substrate are carried out simultaneously.

It is a further object of the present invention to provide a single-step bumping/bonding method for forming semiconductor packages that does not require an underfill process.

It is another further object of the present invention to provide a single-step bumping/bonding method for forming semiconductor packages that is superior to either a wire bonding or a flip chip bonding method.

It is still another object of the present invention to provide a single-step bumping/bonding method for forming semiconductor packages capable of producing IC circuits utilizing area array input-output pads.

It is yet another object of the present invention to provide a single-step bumping/bonding method that is applicable to 3-D packaging, ultra-thin packaging and direct chip attachment techniques.

It is still another further object of the present invention to provide a semiconductor package of two electronic substrates electrically connected together by solder bumps which can be formed in a single bumping/bonding step.

It is yet another further object of the present invention to provide a semiconductor package of an IC chip/PCB board having electrical communication established therein between by solder balls formed in a single bumping/bonding step.

SUMMARY OF THE INVENTION

In accordance with the present invention, a semiconductor package of two electronic substrates electrically connected together by solder bumps and a single-step bumping/bonding method for forming such semiconductor packages are disclosed.

In a preferred embodiment, a semiconductor package of two electronic substrates that are electrically connected together by solder bumps can be provided which includes a first electronic substrate that has a first plurality of conductive pads formed on a first surface insulated from one another by a first insulating material layer, the first electronic substrate may further include a first plurality of apertures through the substrate, the first plurality of conductive pads and the first insulating material layer with one aperture corresponds to each conductive pad, a second electronic substrate that has a second plurality of conductive pads formed on a second surface insulated from one another by a second insulating material layer, the first plurality may be equal to or different from the second plurality, one of the first and second electronic substrates is a silicon wafer while the other one is a printed circuit board, a first plurality of solder bumps mechanically and electrically connecting the first plurality of conductive pads to the second plurality of conductive pads, and a first plurality of conductive plugs each filling one of the first plurality of apertures in electrical communication and formed integrally with one of the first plurality of solder bumps.

In the semiconductor package formed of two electronic substrates electrically connected together by solder bumps, the first electronic substrate may be a silicon wafer and the second electronic substrate may be a printed circuit board, or vice versa. The first electronic substrate may be a silicon wafer and the first plurality of conductive pads may further include a layer of under-bump-metallurgy (UBM) material on top. The first and the second plurality of conductive pads may be input/output (I/O) pads. The first electronic substrate may be a silicon wafer and the first insulating material layer may be a passivation layer. The second electronic substrate may be a printed circuit board and the second insulating material layer may be a solder mask. The first plurality of apertures each may have a sidewall coated with an adhesion promoter. The first plurality of solder bumps may be reflown into a plurality of solder balls. The first plurality of solder bumps may each have a height between about 50 $\mu$m and about 100 $\mu$m.

The present invention is further directed to a single-step bumping/bonding method for forming semiconductor packages which can be carried out by the operating steps of first providing a first electronic substrate that has a first plurality of conductive pads formed on a first surface insulated from one another by a first insulating material layer, forming a first plurality of apertures through the first electronic substrate, the first plurality of conductive pads and the first insulating material layer with one aperture corresponds to each conductive pad, providing a second electronic substrate that has a second plurality of conductive pads formed on a second surface insulated from one another by a second insulating material layer, the first plurality may be equal to or different than the second plurality, to one of the first and the second electronic substrate is a silicon wafer while the other is a printed circuit board, positioning the first electronic substrate juxtaposed to the second electronic substrate such that the first plurality of conductive pads faces the second plurality of conductive pads, and then depositing into the first plurality of apertures a solder material filling the apertures and forming a first plurality of solder bumps in-between the first and second electronic substrates mechanically and electrically connecting the first plurality of conductive pads to the second plurality of conductive pads.

The single-step bumping/bonding method for forming semiconductor packages may further include the step of providing the first electronic substrate in a silicon wafer and providing the second electronic substrate in a PCB. The method may further include the step of forming the first plurality of apertures by laser drilling or by micro-electro-mechanical system (MEMS) machining. The deposition step for the solder material may further include a solder injection or solder screen printing technique. The method may further include the step of heat treating the semiconductor package at a temperature higher than a reflow temperature of the solder material. The method may further include the step of annealing the first plurality of solder bumps to cause them reflown into solder balls. The method may further include the step of removing at least ⅓ of the total thickness of the first electronic substrate on an inactive side prior to the aperture-forming step. The method may further include the step of coating a sidewall in the first plurality of apertures with an adhesion promoter prior to depositing the solder material. It should be understood that the adhesion promoter not only enhances the adhesion of the solder material, but also improves the electrical properties such as eliminating current leakage. The method may further include the steps of depositing and patterning an under-bump-metallurgy layer onto the first plurality of conductive pads when the first electronic substrate is a silicon wafer prior to depositing the solder material. The method may further include a step of providing the first electronic substrate in a printed circuit board and the second electronic substrate in a silicon wafer.

BRIEF DESCRIPTION OF THE DRAWINGS

These objects, features and advantages of the present invention will become apparent from a close examination of the following specification and the appended drawings in which.

DETAILED DESCRIPTION OF THE PREFERRED EMBODIMENT

Figure 1A:
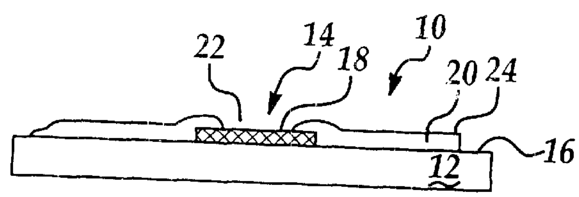
FIG. 1A is an enlarged, cross-sectional view of a conventional pre-processed semiconductor substrate which has a bond pad and a passivation layer formed on top.
Figure 1B:
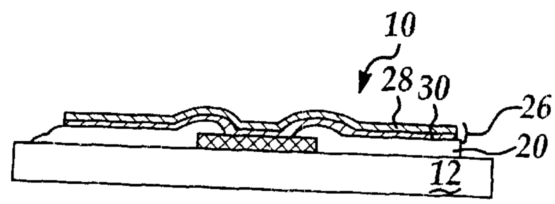
FIG. 1B is an enlarged, cross-sectional view of the conventional semiconductor structure of FIG. 1A with an under-bump-metallurgy layer formed on top.
Figure 1C:
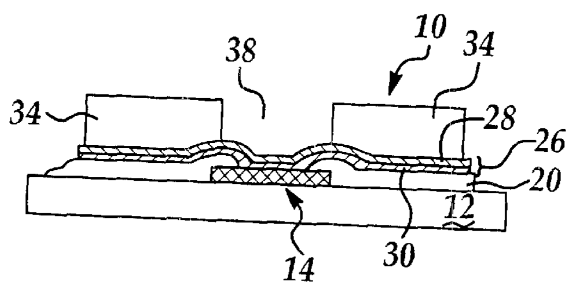
FIG. 1C is an enlarged, cross-sectional view of the conventional semiconductor structure of FIG. 1B with a photoresist layer deposited and defined on top.
Figure 1D:
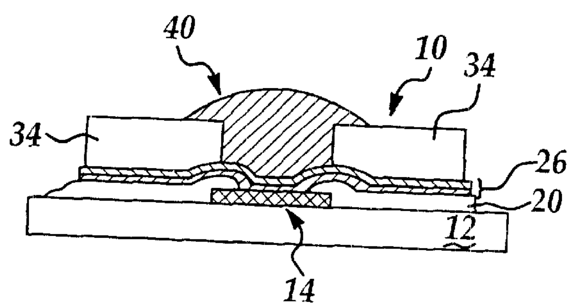
FIG. 1D is an enlarged, cross-sectional view of the conventional semiconductor structure of FIG. 1C with a solder material deposited in the window opening for the solder bump.
Figure 1E:
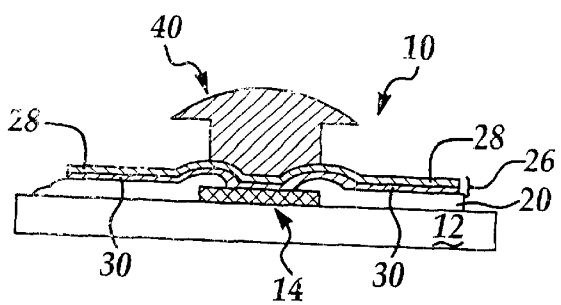
FIG. 1E is an enlarged, cross-sectional view of the conventional semiconductor structure of FIG. 1D with the photoresist layer removed by a wet etching process.
Figure 1F:
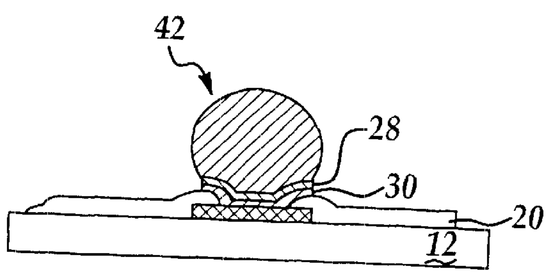
FIG. 1F is an enlarged, cross-sectional view of the conventional semiconductor structure of FIG. 1E with the exposed UBM layer removed and the solder bump reflown into a solder ball.

The present invention discloses a single-step bumping/bonding method for forming semiconductor packages and the packages formed by the simultaneous bumping/bonding method.

In the method, the single-step bumping/bonding for forming semiconductor packages can be carried out by first providing a electronic substrate that has a first plurality of conductive pads formed on a first surface insulated from each other by a first insulating material layer, then forming a first plurality of apertures through the first electronic substrate, the first plurality of conductive pads, and the first insulating material layer with one aperture formed corresponds to each conductive pad, then providing a second electronic substrate that has a second plurality of conductive pads formed on a second surface insulated from each other by a second insulating material layer, the first plurality may be equal to or different from the second plurality, one of the electronic substrates is a silicon wafer, while the other electronic substrate is a printed circuit board. The step for forming the first plurality of apertures may be accomplished by a technique such as laser drilling, micro-electro-mechanical-system machining, or other suitable method. The solder material may be deposited into the plurality of apertures by a technique such as solder injection, solder screen printing or solder stencil printing.

The invention is further directed to a semiconductor package formed of two electronic substrates that are electrically and mechanically connected together by solder bumps formed between the substrates which include a first electronic substrate that has a first plurality of conductive pads, i.e. I/O pads, formed on a first surface insulated by a first insulating material layer, the first electronic substrate further having a first plurality of apertures through the substrate, the first plurality of conductive pads and the first insulating material layer with one aperture formed in each conductive pad, a second electronic substrate that has a second plurality of conductive pads formed on a second surface insulated by a second insulating material layer, the first plurality may be equal to or different than the second plurality, one of the first and the second electronic substrates is a silicon wafer, while the other is a printed circuit board, and a first plurality of solder bumps mechanically and electrically connecting the first plurality of conductive pads to the second plurality of conductive pads thus forming the semiconductor package.

In the semiconductor package formed by the present invention novel method, one of the electronic substrates may be a silicon wafer while the other may be a printed circuit board. When the electronic substrate is a silicon wafer, the plurality of conductive pads may further include a layer of under-bump-metallurgy (UBM) material deposited on top. When the electronic substrate is a silicon wafer, the insulating material layer deposited for providing insulation between conductive pads may be a passivation material layer. When the electronic substrate is a printed circuit board, the insulating material layer may be a solder mask. In each of the plurality of apertures formed in the silicon wafer, the sidewall may be further coated with an adhesion promoter by a plating method. In the semiconductor package, the plurality of solder bumps may have been reflown into a plurality of solder balls.

Figure 2A:
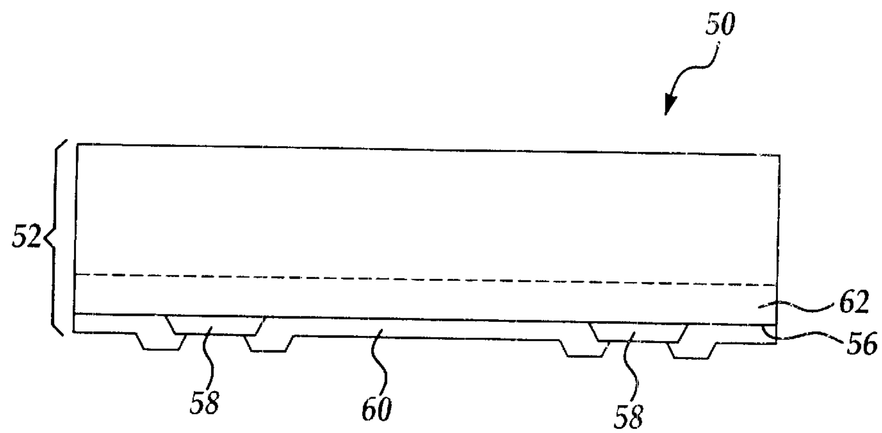
FIG. 2A is an enlarged, cross-sectional view, of a present invention wafer structure having a plurality of I/O pads and a passivation layer formed on an active surface.
Figure 2B:
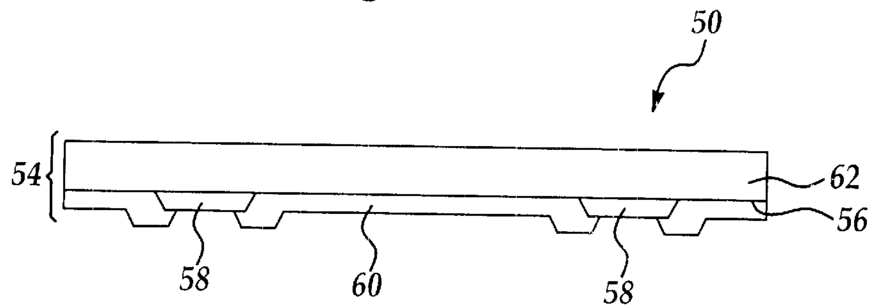
FIG. 2B is an enlarged, cross-sectional view of the present invention wafer structure of FIG. 2A having a portion of the back side removed.
Figure 2C:
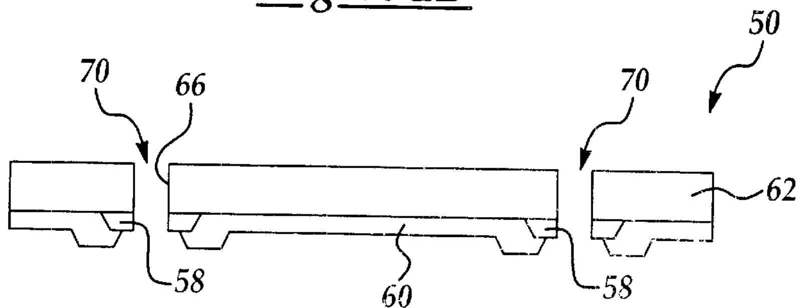
FIG. 2C is an enlarged, cross-sectional view of the present invention wafer structure of FIG. 2B having a plurality of apertures formed through the plurality of I/O pads and the wafer structure.

Referring now to FIG. 2A, wherein a present invention electronic substrate, i.e. a silicon wafer 50 is shown. The silicon wafer 50 has a significant thickness 52 which is thinned down to a thickness 54 (shown in FIG. 2B) in order to facilitate the formation of apertures therethrough. On an active surface 56 of the silicon wafer 50, is formed a plurality of conductive pads 58 insulated by a passivation layer 60 deposited on top and defined to expose the conductive pads 58. After the backside of the silicon wafer 50 is removed, only the active side 62 remains as shown in FIG. 2B.

Into and through the thinned front side 62 of the silicon wafer 50, is then formed a plurality of apertures 70 through the silicon substrate 50 and the conductive pad 58. The aperture formation process can be carried out by laser drilling or by the micro-electro-machining system technique. The backside of the silicon wafer 50 can be removed by a method such as chemical mechanical polishing. The thickness removed may be in a range between about 600 $\mu$m and about 800 $\mu$m, leaving the front side 62 of the silicon wafer 50 with a thickness between about 30 $\mu$m and about 100 $\mu$m. The word "about" used in this writing means a range of values that is ±10% of the average value given. For instance, about 100 $\mu$m means a range of values between 90 $\mu$m and 110 $\mu$m.

The conductive pads 58, i.e. the I/O pads can be advantageously formed of a conductive metal such as aluminum, copper or alloys thereof. The passivation layer may be advantageously formed of silicon nitrite for preventing moisture penetration.

Figure 2D:
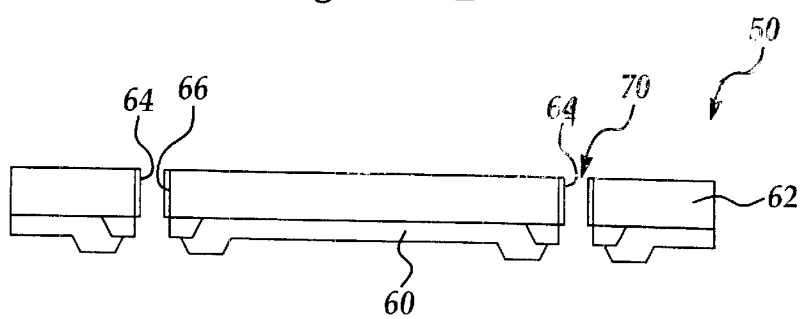
FIG. 2D is an enlarged, cross-sectional view of the present invention wafer structure of FIG. 2C having an adhesion promoter coated on the sidewalls of the plurality of apertures.
Figure 2E:
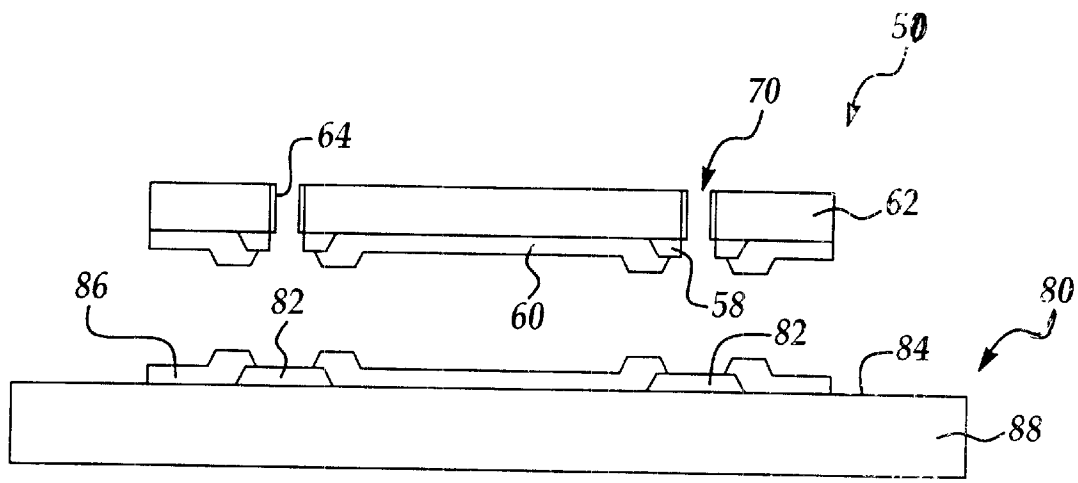
FIG. 2E is an enlarged, cross-sectional view of the present invention wafer structure of FIG. 2D positioned over an electronic substrate with corresponding I/O pads.
Figure 2F:
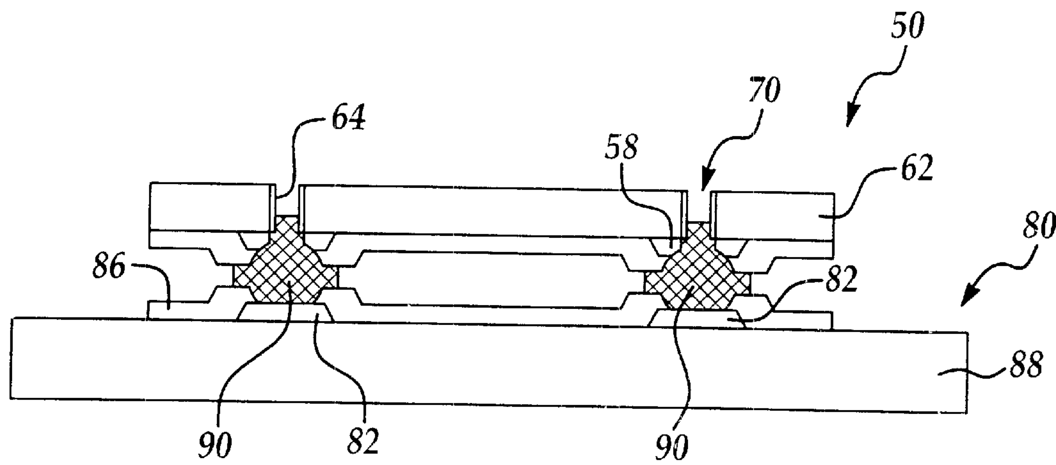
FIG. 2F is an enlarged, cross-sectional view of the present invention wafer structure and the electronic substrate of FIG. 2E with a solder material reflown into the plurality of apertures forming solder bumps between the I/O pads on the wafer structure and the I/O pads on the electronic substrate.

Optionally, as shown in FIG. 2D, an adhesion promoter layer 64 may be formed in the plurality of apertures 70 to cover the sidewall 66 of the apertures. The adhesion promoter layer may be advantageously formed by a plating method and has a good wetting characteristic toward the solder material used in the subsequent solder filling process. Furthermore, the layer improves the electrical properties of the final structure such that leakage current can be avoided.

Figure 2G:
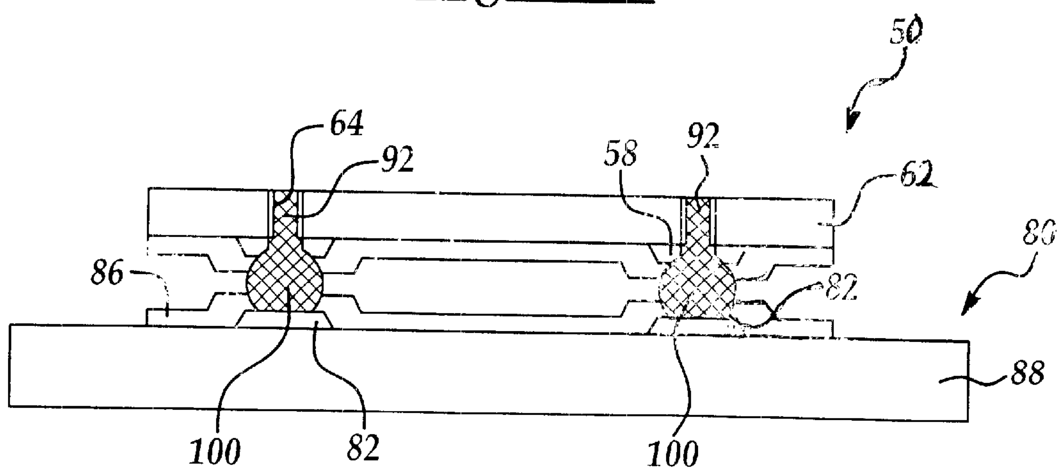
FIG. 2G is an enlarged, cross-sectional view of the present invention wafer structure and the electronic substrate of FIG. 2F after being bonded together by the solder bumps and being reflown into solder balls.

In the next step of the method, the silicon wafer 50 is positioned juxtaposed to an electronic substrate 80. With each of the plurality of conductive pads 58 facing one of the plurality of conductive pads 82 formed on a top surface 84 of the electronic substrate 80. An insulating material layer 86, such as a solder mask is used to insulate the plurality of conductive pads, or I/O pads 82. The electronic substrate 80 may be formed of an insulating material 88 such as a polymer. After the silicon wafer 50 and the electronic substrate 80, i.e. a printed circuit board, are suitably clamped together, a liquid solder material may be flown through the plurality of apertures 70 to fill a gap between the silicon wafer 50 and the substrate 80 to form solder bumps 90. It should be noted that the flow of solder material into the apertures 70 effectively bonds the plurality of conductive pads 58 on the silicon wafer 50 to the plurality of conductive pads 82 on the electronic substrate 80 and thus, the bumping and the bonding process are carried out simultaneously. After a solder reflow process is conducted at a temperature that is at least the reflow temperature of the solder material utilized, i.e. a 63/37 Pb/Sn material, the solder bumps 90 are reflown into solder balls 100. This is shown in FIG. 2G. In the same reflow process, the solder material further fills up apertures 70 and forms a plurality of conductive plugs 92. It should be noted that the plurality of metal plugs 92 are formed integrally with the solder balls 100. The plurality of metal plugs 92 allows a unique opportunity for the silicon wafer 50 to be bonded to another electronic substrate, if desired. A present invention novel structure of a semiconductor package formed by two electronic substrates, i.e. a silicon wafer 50 and an electronic substrate 80, that are electrically connected together by solder balls 100. The process further demonstrates the unique aspect of the method in that the bumping process and the bonding process are carried out simultaneously in a single step.

The present invention novel method may further be conducted by providing the plurality of apertures through an electronic substrate, instead of through the silicon wafer. This is shown in FIGS. 3A–3F.

Figure 3A:
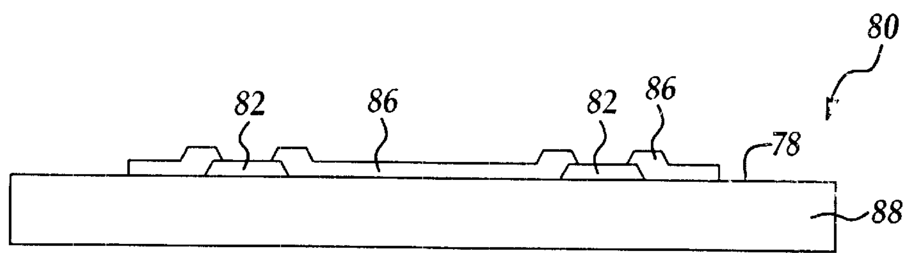
FIG. 3A is an enlarged, cross-sectional view of a present invention electronic substrate having a plurality of I/O pads and a solder mask formed on a top surface.
Figure 3B:
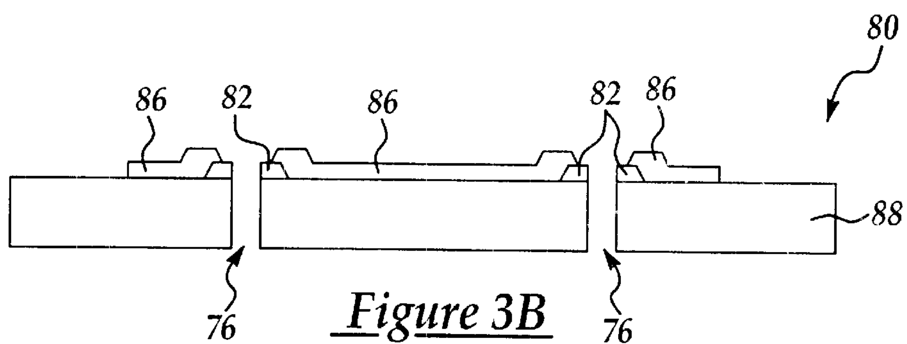
FIG. 3B is an enlarged, cross-sectional view of the electronic substrate of FIG. 3A having a plurality of apertures formed through the plurality of I/O pads.
Figure 3C:
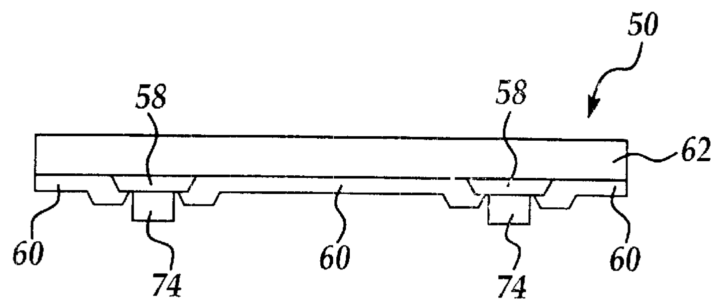
FIG. 3C is an enlarged, cross-sectional view of the present invention wafer structure having UBM layers formed on the plurality of I/O pads.
Figure 3D:
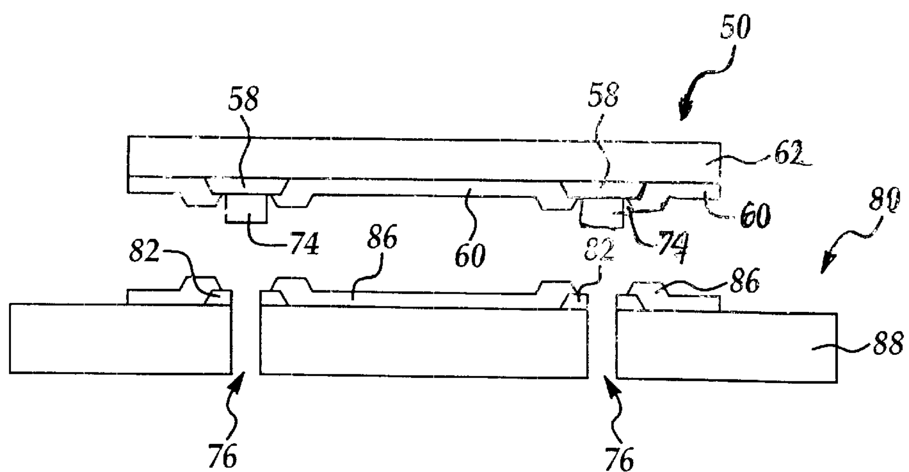
FIG. 3D is an enlarged, cross-sectional view of the present invention wafer structure of FIG. 3C positioned over a present invention electronic substrate that has a plurality of apertures formed therein for receiving a solder material.
Figure 3E:
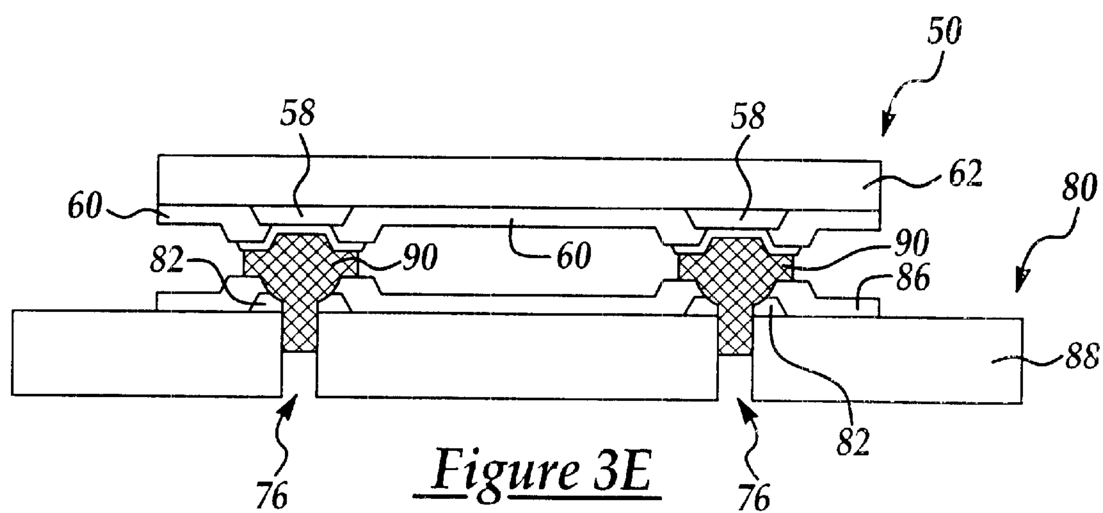
FIG. 3E is an enlarged, cross-sectional view of the present invention wafer structure and the present invention electronic substrate of FIG. 3D with a solder material flown through a plurality of apertures in the electronic substrate forming solder bumps between the wafer structure and the substrate.
Figure 3F:
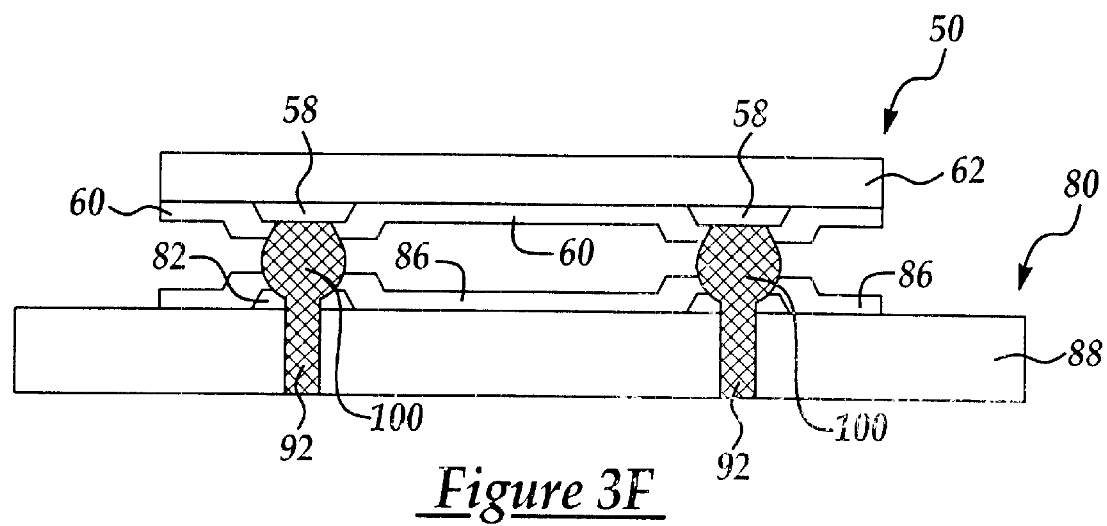
FIG. 3F is an enlarged, cross-sectional view of the present invention structure of FIG. 3E after the solder bumps are reflown into solder balls.

FIG. 3A shows an electronic substrate 80 that is formed of a polymeric material 88. On a top surface 78 of the electronic substrate 80, is then formed a plurality of conductive pads 82, i.e. such as I/O pads that are insulated by an insulating material such as a solder mask 86. Through the plurality of conductive pads 82, is then formed a plurality of apertures 76 by a technique similar to the technique used in forming apertures through the silicon wafer, i.e. by laser drilling or by MEMS. For bonding to the electronic substrate 80, a silicon wafer 50 is then provided as shown in FIG. 3C. Onto each of a plurality of conductive pads 58, is first formed by a standard deposition/lithography method a plurality of UBM layers 74. The silicon wafer 50 is then positioned over the electronic substrate 80, as shown in FIG. 3D, for effecting a bumping-bonding process.

A liquid solder material flown through the apertures 76 to fill a gap between the silicon wafer 50 and the electronic substrate 80 and is limited by the UBM layer 74 (shown in FIG. 3D) to form solder bumps 90. A similar solder reflow process is then conducted to form solder balls 100 and conductive plugs 82, shown in FIG. 3F.

The present invention novel method for the single-step forming of a semiconductor package by simultaneous bumping/bonding and packages formed by the method have therefore been amply described in the above description and in the appended drawings of FIGS. 2A–3F.

While the present invention has been described in an illustrative manner, it should be understood that the terminology used is intended to be in a nature of words of description rather than of limitation.

Furthermore, while the present invention has been described in terms of a preferred and alternate embodiment, it is to be appreciated that those skilled in the art will readily apply these teachings to other possible variations of the inventions.

The embodiment of the invention in which an exclusive property or privilege is claimed are defined as follows.

What is claimed is:

1. A semiconductor package of two electronic substrates electrically connected together by solder bumps comprising:

a first electronic substrate having a first plurality of conductive pads formed on a first surface insulated from each other by a first insulating material layer, said first electronic substrate further having a first plurality of apertures through said substrate, said first plurality of conductive pads and said first insulating material layer with one aperture corresponds to each conductive pad wherein said first plurality of apertures each having a sidewall coated with an adhesion promoter that is not a part of the first plurality of conductive pads, a second electronic substrate having a second plurality of conductive pads formed on a second surface insulated from each other by a second insulating material layer, said first plurality being equal to or different than said second plurality, one of said first and second electronic substrates being a silicon wafer while the other being a printed circuit board (PCB), a first plurality of solder bumps mechanically and electrically connecting said first plurality of conductive pads to said second plurality of conductive pads, and wherein said first plurality of solder bumps each filling one of said first plurality of apertures to form a first plurality of conductive plugs.

2. A semiconductor package of two electronic substrates electrically connected together by solder bumps according to claim 1, wherein said first electronic substrate being a silicon wafer and said second electronic substrate being a printed circuit board.

3. A semiconductor package of two electronic substrates electrically connected together by solder bumps according to claim 1, wherein said first electronic substrate being a printed circuit board and said second electronic substrate being a silicon wafer.

4. A semiconductor package of two electronic substrates electrically connected together by solder bumps according to claim 1, wherein both of said first and second electronic substrates are silicon wafers.

5. A semiconductor package of two electronic substrates electrically connected together by solder bumps according to claim 1, wherein said first electronic substrate being a silicon wafer and said first plurality of conductive pads further comprises a layer of under-bump-metallurgy (UBM) material on top.

6. A semiconductor package of two electronic substrates electrically connected together by solder bumps according to claim 1, wherein said first electronic substrate being a silicon wafer and said first insulating material layer being a passivation layer.

7. A semiconductor package of two electronic substrates electrically connected together by solder bumps according to claim 1, wherein said second electronic substrate being a printed circuit board and said second insulating material layer being a solder mask.

8. A semiconductor package of two electronic substrates electrically connected together by solder bumps according to claim 1, wherein said first plurality of solder bumps being reflown into a plurality of solder balls.

9. A semiconductor package of two electronic substrates electrically connected together by solder bumps according to claim 1, wherein said first plurality of solder bumps each having a height between about 50 $\mu$m and about 100 $\mu$m.

* * * * *